United States Patent [19]
McEachern et al.

[11] Patent Number: 4,642,563
[45] Date of Patent: Feb. 10, 1987

[54] POWER LINE IMPULSE MEASUREMENT SYSTEM

[75] Inventors: Alexander McEachern, Oakland; Steve Terry, San Carlos, both of Calif.

[73] Assignee: Basic Measuring Instruments, Foster City, Calif.

[21] Appl. No.: 738,584

[22] Filed: May 28, 1985

[51] Int. Cl.$^4$ .................. G01R 1/00; G01R 19/00; G01R 29/02
[52] U.S. Cl. .................. 324/111; 324/102; 364/486
[58] Field of Search .................. 324/111, 112, 102; 364/487, 483, 486; 361/110, 111

[56] References Cited

U.S. PATENT DOCUMENTS

Re. 30764 10/1981 Muir et al. .
3,614,408 10/1971 Watkins et al. .
4,006,413 2/1977 Silberberg .
4,072,851 2/1978 Rose .
4,224,672 9/1980 Leleu et al. .
4,365,193 12/1982 Bollero et al. .
4,399,512 8/1982 Soma et al. .
4,476,531 10/1984 Marino et al. .
4,495,586 1/1985 Andrews .
4,495,642 1/1985 Zellmer .

FOREIGN PATENT DOCUMENTS 83-02024 6/1983 PCT Int'l Appl. .................. 364/487
0962821 9/1982 U.S.S.R. .................. 324/111

OTHER PUBLICATIONS

"Capture Fast Waveforms Accurately with a 2 Channel Programmable Digitizer", Electronic Design 3; Feb. 1, 1980, pp. 50–52.

Primary Examiner—Reinhard J. Eisenzopf
Assistant Examiner—Vinh P. Nguyen
Attorney, Agent, or Firm—Limbach, Limbach & Sutton

[57] ABSTRACT

An impulse measurement system for displaying impulses in an alternating current electromagnetic energy waveform, the impulses generally occurring at frequencies substantially greater than that for the waveform. The system comprises high speed sample memory for recording the high frequency impulses, memory for recording the waveform, and display for receiving the high frequency impulses and the waveform from the high speed memory and the waveform memory, respectively, and displaying both the high frequency impulses and the waveform simultaneously, thereby permitting efficacious identification of the cause of the impulses.

15 Claims, 2 Drawing Figures

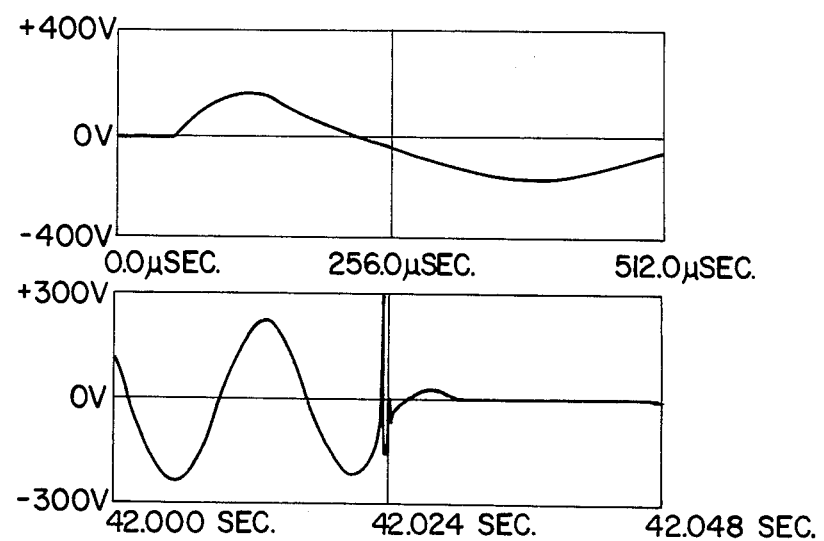
FIG.\_1.

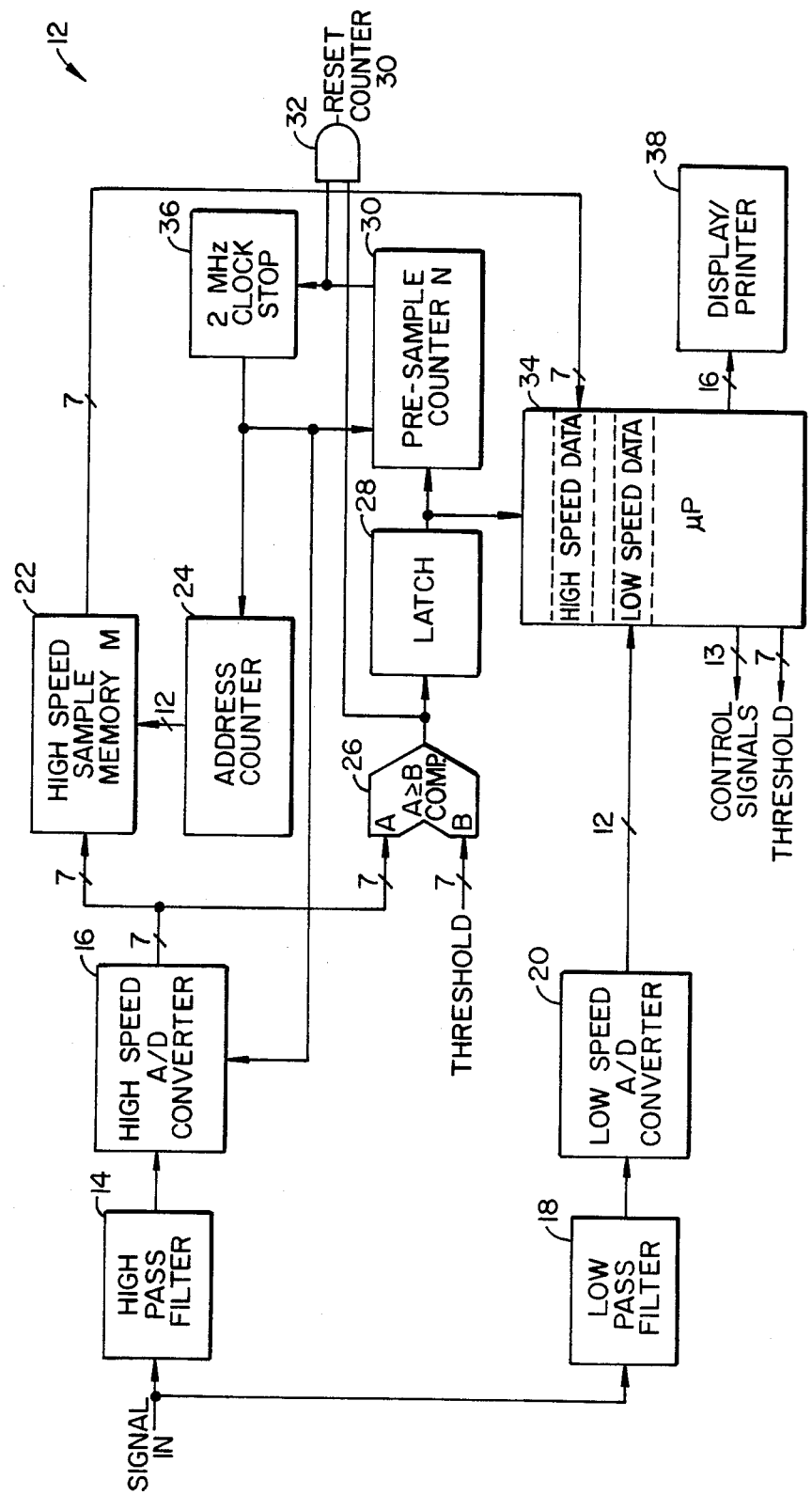
FIG._2.

POWER LINE IMPULSE MEASUREMENT SYSTEM

DESCRIPTION

1. Technical Field

This invention relates to electrical detection apparatus, and more particularly, to a power line impulse measurement system.

2. Background Art

Detectors which are capable of detecting disturbances on alternating current (AC) power lines are common in the art. One type of power disturbance is the occurrence of impulses, that is, extremely short voltage disturbances. The duration of these short disturbances is generally in the order of 500 nanoseconds to 1,000 microseconds. These impulses are generally caused by lightning strikes, inductive loads, capacitive loads, static discharges, etc. These impulses are undesirable in that they can disrupt or damage electronic equipment such as computers or microprocessor-based equipment. It is, therefore, extremely important to identify the cause of such impulses. Moreover, a graphical display of the impulse, indicating its position in relation to the AC waveform, can assist the user in identifying the exact cause of the impulses. For example, if the impulse occurred near the zero-crossing of the AC waveform, the cause of the impulse may be diagnosed as an aberration during electronic switching. Thus diagnosed, the electronic equipment could be redesigned. In addition to the capability of displaying the impulse in relation to the AC waveform, it is equally important to be able to view the AC waveform that is immediately before and after the occurrence of the impulse.

The ideal impulse measurement system should provide not only detection of these high frequency impulses, but also be capable of presenting these impulses in conjunction with the lower-frequency AC waveform in order to illustrate the cause of these impulses. In such an ideal system, the simultaneous display of both the high frequency impulses and the low frequency AC waveform is desirous for identifying the cause of the impulses.

DISCLOSURE OF THE INVENTION

In view of the prior art, it is a major object of the present invention to provide a power line impulse measurement system that is capable of presenting both the high frequency impulses and the low frequency AC power waveform in order to identify the cause of the impulses.

In order to accomplish the above and still further objects, the present invention provides an impulse measurement system for displaying impulses in an alternating current electromagnetic energy waveform, the impulses generally occurring at frequencies substantially greater than that for the waveform. The system comprises high speed sample memory means for recording the high frequency impulses, memory means for recording the waveform, and display means for receiving the high frequency impulses and the waveform from the high speed memory means and the memory means, respectively, and displaying both the high frequency impulses and the waveform simultaneously, thereby permitting efficacious identification of the cause of the impulses.

Other objects, features, and advantages of the present invention will appear from the following detailed description of the best mode of a preferred embodiment, taken together with the accompanying drawings.

BRIEF DESCRIPTION OF THE DRAWINGS

FIG. 1 is a graphical display generated by a power line impulse measurement system of the present invention, displaying both the high frequency impulse and the low frequency AC power waveform containing the high frequency impulse; and FIG. 2 is a block diagram of the power line impulse measurement system of FIG. 1.

BEST MODE FOR CARRYING OUT THE INVENTION

To analyze and identify an abnormal impulse that is present in an AC waveform, prior art techniques extract only the high frequency impulse for analysis. Or, the sampling rate may be speeded up in order to view the high frequency impulse upon the detection of such an impulse. The sampling rate is then returned to a lower speed after a certain amount time has elapsed. Such a dual speed technique is disclosed in Leleu et al., U.S. Pat. No. 4,224,672; this technique produces an effect that is similar to that of a digital oscilloscope. These techniques, however, fail to give the user a simple graphical display of both the high frequency impulse and the low frequency waveform in order to permit easy analysis of the disturbance.

Accordingly, the present invention provides a power line impulse measurement system that is capable of presenting simultaneous, correlated displays of the high frequency impulse and the low frequency waveform, as best shown in FIG. 1.

Referring to FIG. 2, there is shown such a power line impulse measurement system, designated 12. System 12 comprises a high pass filter 14, a high speed analog to digital (A/D) converter 16 for receiving and sampling the high frequency impulses. In addition, system 12 includes a low pass filter 18 and a low speed A/D converter 20 for receiving and sampling the low speed AC waveform. Further, system 12 comprises a high speed sample memory 22, an address counter 24, a comparator 26, a latch 28, a pre-sample counter 30, a recovery counter 32, and processing means 34. A clock 36 and a display/printer 38 are also provided.

In operation, high pass filter 14 and low pass filter 18 first receive the input signal, for example, an AC power waveform. High pass filter 14, a conventional two-pole filter, is controlled by processing means 34 which is a conventional microprocessor in the preferred embodiment. For example, if the frequency of the input waveform is 60 Hz, then microprocessor 34 sets the corner on knee high pass filter 14 at 600 Hz. If the frequency of the waveform is 400 Hz, the corner would be set at 4 kilohertz. After the user has designated the frequency of the low frequency AC waveform, microprocessor 34 responds by providing the appropriate control signals to close the appropriate electronic switches in filters 14 and 18. These switches are used to correct the various reactive and resistive components in the filters in order to provide the desired filter characteristics. In addition, high pass filter 14 has auto ranging capabilities to accommodate different amplitudes of the input waveform.

The filtered, high frequency impulses are then inputted into high speed A/D converter 16. A/D converter 16 in the preferred embodiment is a 300 nanosecond A/D converter manufactured by Telmos of Santa Clara, Calif. A/D converter 16 has a sample rate dictated by the two megahertz clock 36. Simultaneously, the input waveform is received by low pass filter 18, the output of which is then converted by low speed A/D converter 20. The digital output of low speed A/D converter 20 is stored in microprocessor 34.

The digital output of high speed A/D converter 16 is stored in high speed sample memory 22. Memory 22 in the preferred embodiment is an 8-bit, 2K memory. Memory 22 is capable of receiving and storing an arbitrarily predetermined amount of information, e.g., "M" samples. The address for each of the locations of memory 22 in which a sample is stored is provided by address counter 24, which in turn is controlled by clock 36. In the preferred embodiment, address counter 24 has the characteristic of restarting the generation of addresses by beginning at position zero after the highest address has been reached. Each of the generated addresses is incremented for each clock cycle from clock 36. In this manner the addresses to memory 22 are cycled through in address sequence. This causes memory 22 to receive, continuously, information from A/D converter 16 and to store that information in an ordered set of memory locations. Over time, the information in the ordered set of memory locations is overwritten with new information as the address is repeated.

In addition, the digital outputs of A/D converter 16 are received by comparator 26. Comparator 26 is provided with a threshold level by microprocessor 34. This threshold is predetermined by the user who designates the magnitude of impulse that he is interested in analyzing. If the digital signals from A/D converter 16 exceed the threshold value, comparator 26 outputs this information to latch 28. Latch 28 in turn activates pre-sample counter 30. Counter 30 then proceeds to count a predetermined number of clock periods before it outputs a signal that stops clock 36. The inactivation of clock 36 terminates the storage of high frequency information by memory 22.

Counter 30 may be pre-set to have an arbitrary number, e.g., "N." This number "N" represents the number of samples which will be received by memory 22 after the detection of an impulse. The user selects "N" such that it is less than or equal to "M," the maximum capacity of memory 22. The integers "M" and "N" are selected such that memory 22 stores samples which occur both before and after the occurrence of the high frequency impulse in order to permit an efficacious analysis of the disturbance. If "N" is less than "M," memory 22 will contain some pre-impulse information since memory 22 is a circulating-type memory device. If "N" is equal to M/2, memory 22 will contain an equal amount of information of the waveform which occurred both before and after the occurrence of thie high frequency impulse.

Further, the output of comparator 26 and the output of counter 30 are received by NAND gate 32, which in turn resets counter 30. The output of latch 28 activates microprocessor 34 such that it continues to store the low frequency AC waveform information for a designated number of the AC waveform cycles. When this is completed, microprocessor 34 retrieves both the stored information from high speed memory 22 and the stored information from the low speed memory that is internal to microprocessor 34. The information from high speed memory 22 is retrieved by "bumping" address counter 24 "N" clock cycles. This causes high speed memory 22 to output its data such that the earliest in time is outputted first and the most recent last. Microprocessor 34 then outputs both the high speed information and low speed information to display/printer 38, which in turn converts the digital information into analog displays, as best shown in FIG. 1.

The bottom display of FIG. 1 illustrates an AC waveform that contains a high frequency impulse. This display illustrates the AC waveform that occurred immediately before and after the occurrence of that impulse. Immediately above that display is an illustration of that impulse, presented at a higher frequency in order to fully illustrate the characteristic of the impulse. Thus displayed, a correlated high frequency impulse positioned immediately adjacent to an AC waveform containing the impulse, a user of the system can readily and more effectively determine the cause of such an impulse.

It will be apparent to those skilled in the art that various modifications may be made within the spirit of the invention and the scope of the appended claims.

We claim:

1. An impulse measurement system for displaying impulses which occur in alternating current electromagnetic energy waveform, said waveform having a plurality of periodic cycles which defines a waveform frequency, and each of said impulses occurring at an impulse frequency that is substantially greater than said waveform frequency, wherein the presence of said impulse defines an occurrence, and said impulse is a manifestation of an event, comprising
    high frequency filtering means for receiving and filtering said waveform, and passing filtered impulses;
    low frequency filtering means for receiving and filtering said waveform, and passing a filtered waveform;
    high speed sample memory means for recording said filtered impulses;
    memory means for recording said filtered waveform; and
    comparator means for receiving both said filtered impulse and a predetermined amplitude threshold signal and generating a memory recording signal for controlling the recording of said filtered waveform by said memory means, said memory recording signal is generated when said filtered impulse exceeds said amplitude threshold signal;
    display means for receiving said filtered impulses and said filtered waveform from said high speed memory means and said memory means, respectively, and displaying both said filtered impulses and said filtered waveform simultaneously, thereby permitting efficacious identification of the cause of said impulses.

2. The impulse measurement system as claimed in claim 1, wherein a predetermined number of said cycles of said waveform before and after the occurrence of said impulse is stored.

3. The impulse measurement system as claimed in claim 2, wherein the recording of said predetermined number of said cycles after the occurrence of said impulse is initiated by said memory recording signal.

4. The impulse measurement system as claimed in claim 1, 2 or 3, further comprising
    pre-sample counter means for controlling the amount of data of said filtered waveform recorded by said high speed memory means such that a designated amount of data which occurs before and after the occurrence of said filtered impulse is recorded pursuant to the equation $$N \leq M$$

where
- M is the maximum capacity of said high speed memory
- N is the predetermined number of said filtered waveform stored after the occurrence of said filtered impulse as determined by said pre-sample counter means.

5. An impulse measurement system for displaying impulses which occur in alternating current electromagnetic energy waveform, said waveform having a plurality of periodic cycles which defines a waveform frequency, and each of said impulses occurring at an impulse frequency that is substantially greater than said waveform frequency, wherein the presence of said impulse defines an occurrence and said impulse is a manifestation of an event, comprising

- high frequency filtering means for receiving and filtering said waveform, and passing filtered impulses and excluding said waveform;
- high speed analog to digital converter means for receiving and sampling said filtered impulse and for converting said samples into digital signals representative of said filtered impulse;
- high speed sample memory means for recording said impulse digital signals;
- low frequency filtering means for receiving and filtering said waveform, and passing a filtered waveform and excluding said impulses;
- low speed analog to digital converter means for receiving and sampling said filtered waveform and for converting said samples into digital signals representative of said filtered waveform;
- memory means for recording said waveform digital signals;
- comparator means for receiving both said impulse digital signals and a predetermined amplitude threshold signal and generating a memory recording signal for controlling the recording of said waveform digital signals, said memory recording signal is generated when said impulse digital signals exceed said amplitude threshold signal; and
- display means for receiving said impulse digital signals and said waveform digital signals from said high speed memory means and said memory means, respectively, and for displaying both said impulse digital signals and said waveform digital signals simultaneously, thereby permitting efficacious identification of the cause of said impulses.

6. The impulse measurement system as claimed in claim 5, wherein a predetermined number of said cycles of said waveform before and after the occurrence of said impulse is stored.

7. The impulse measurement system as claimed in claim 6, wherein the recording of said predetermined number of said cycles after the occurrence of said impulse is initiated by said memory recording signal.

8. The impulse measurement system as claimed in claim 5, 6 or 7, further comprising
pre-sample counter means for controlling the amount of data of said waveform digital signals recorded by said high speed memory means such that a designated amount of data which occurs before and after the occurrence of said impulse digital signals is recorded pursuant to the equation $$N \leq M$$

where
- M is the maximum capacity of said high speed memory
- N is the predetermined number of said waveform digital signals stored after the occurrence of said impulse digital signals as determined by said pre-sample counter means.

9. The impulse measurement system as claimed in claim 8, wherein
said memory recording signal activates said pre-sample counter.

10. The impulse measurement system as claimed in claim 15, further comprising
processing means for receiving and processing both said impulse digital signals and said waveform digital signals before forwarding said impulse digital signals and said waveform digital signals to said display means.

11. The impulse measurement system as claimed in claim 10, wherein said processing means is activated by said memory recording signal of said comparator means so as to activate the recording of said impulse digital signals by said processing means.

12. The impulse measurement system as claimed in claim 11, wherein said processing means is similarly activated by said memory recording signal of said comparator means so as to store a predetermined number of said cycles of said waveform digital signals after the occurrence of said impulse digital signals.

13. The impulse measurement system as claimed in claim 12, further comprising
address counter means for cyclically addressing said high speed sample memory means, whereby said data stored in said high speed memory means are overwritten by new said samples.

14. The impulse measurement system as claimed in claim 13, further comprising
pre-sample counter reset means for resetting said pre-sample counter means upon receipt of signals from said comparator means and said pre-sample counter means.

15. The impulse measurement system as claimed in claim 13, wherein said pre-sample counter means generates a signal, further comprising
pre-sample counter reset means for receiving said memory recording signal and said pre-sample counter means signal, and generating a reset signal for resetting said pre-sample counter means.

* * * * *